(12) United States Patent
Lee

(10) Patent No.: US 7,148,115 B2
(45) Date of Patent: Dec. 12, 2006

(54) SEMICONDUCTOR DEVICE AND METHOD FOR FORMING THE SAME

(75) Inventor: Sang Don Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 104 days.

(21) Appl. No.: 10/998,818

(22) Filed: Nov. 30, 2004

(65) Prior Publication Data

US 2006/0035417 A1 Feb. 16, 2006

(30) Foreign Application Priority Data

Aug. 11, 2004 (KR) ............... 10-2004-0063167

(51) Int. Cl.
*H01L 21/331* (2006.01)
(52) U.S. Cl. .................... 438/311; 438/318
(58) Field of Classification Search ........ 438/311, 438/318
See application file for complete search history.

(56) References Cited

U.S. PATENT DOCUMENTS 6,936,875 B1 * 8/2005 Sugii et al. ............ 257/288

OTHER PUBLICATIONS

Malgorzata Jurczak et al., "Silicon-on-Nothing (SON)-an Innovative Process for Advanced CMOS", IEEE, Nov. 2000, pp. 2179-2187, vol. 47, No. 11.

* cited by examiner

*Primary Examiner*—B. William Baumeister
*Assistant Examiner*—Matthew L. Reames
(74) *Attorney, Agent, or Firm*—Heller Ehrman LLP

(57) ABSTRACT

The present invention is related to semiconductor device and method for manufacturing the same. In accordance with the semiconductor device and method for manufacturing the same, at least one opening extending between LDD regions and exposing a buried insulating layer is formed so that a gate electrode surrounds the surface of a channel region. This structure allows the formation of a relatively a thick channel region and decreases the sensitivity of characteristics of the device dependent upon the thickness of the channel region.

7 Claims, 14 Drawing Sheets

SEMICONDUCTOR DEVICE AND METHOD FOR FORMING THE SAME

BACKGROUND OF THE INVENTION

1. Field of the Invention

The present invention generally relates to semiconductor device and method for forming the same, and more specifically, to semiconductor device and method for forming the same wherein a space formed by removing a SiGe epitaxial layer below the gate electrode is filled up by a buried insulating layer and the gate electrode surrounds a Si epitaxial layer to increase the current driving capability of the device and to improve short channel effect.

2. Description of the Prior Art

FIG. 1 is a top-view illustrating a layout of a conventional semiconductor device and FIG. 2 is a cross-sectional diagram taken along the lines I–I' and II–II' of FIG. 1.

Referring to FIGS. 1 and 2, the conventional semiconductor device comprises a semiconductor substrate 10 having an active region defined by a device isolation film 25. A stacked structure of a buried insulating film 50 and a Si epitaxial layer 20 is disposed on the surface of the semiconductor substrate 10. A channel region (not shown) and LDD regions 40 adjacent to the channel region are formed in the Si epitaxial layer 20. A stacked structure of a gate oxide film pattern 30a, a gate electrode 35a and a hard mask insulating film pattern 37a is disposed on the channel region. A sidewall spacer 45 is disposed on a sidewall of the stacked structure. Source/drain regions (not shown) are disposed in the active region at both sides of the sidewall spacer 45.

FIGS. 3a through 3g are cross-sectional diagrams taken along the lines I–I' and II–II' of FIG. 1, illustrating a conventional method for manufacturing the semiconductor device of FIG. 1.

Referring to FIG. 3a, a SiGe epitaxial layer 15 and a Si epitaxial layer 20 are sequentially formed on a semiconductor substrate 10. Thereafter, a device isolation film 25 defining an active region is formed on the semiconductor substrate 10.

Referring to FIG. 3b, an impurity is implanted into the Si epitaxial layer 20 to form a channel region (not shown). A gate oxide film 30, a conductive layer 35 for gate electrode and a hard mask insulating film 37 are then sequentially formed on the entire surface of the semiconductor substrate 10. The gate oxide film 30, the conductive layer 35 and the hard mask insulating film 37 are patterned to form a stacked structure of a gate oxide film pattern 30a, a gate electrode 35a and a hard mask insulating film pattern 37a.

Next, LDD regions 40 are formed in the Si epitaxial layer 20 at both sides of the gate electrode 35a.

Referring to FIG. 3d, a sidewall spacer 45 is formed on a sidewall of the stacked structure. Thereafter, the Si epitaxial layer 20, the SiGe epitaxial layer 15 and a predetermined depth of the semiconductor substrate 10 at both side of the sidewall spacer 45 are etched away to expose LDD region 40, a sidewall of the SiGe epitaxial layer 15, and a sidewall and a surface of the semiconductor substrate 10.

Referring to FIG. 3e, the SiGe, epitaxial layer 15 under the gate electrode 35a is wet etched to form a space under the Si epitaxial layer 20, i.e. under the LDD region 40 and the channel region.

Referring to FIG. 3f, an insulating film (not shown) is formed in the space, the exposed surfaces of the Si epitaxial layer 20 and the semiconductor substrate 100. The insulating film is then wet etched to form a buried insulating film 50 filling the space.

Referring to FIG. 3g, a silicon layer 55 is grown in the active region at both sides of the sidewall spacer where the Si epitaxial layer 20, the SiGe epitaxial layer 150 and a predetermined depth of the semiconductor substrate 10 have been removed. An impurity is then implanted to form source/drain regions in the silicon layer (not shown).

In accordance with the conventional semiconductor device and method for forming the same, the gate electrode is disposed only on the channel region formed in the Si epitaxial layer so that a short channel effect is increased. In order to decrease the short channel effect, the thickness of the channel region must be decreased. However, since the thickness of the channel region determines the characteristics of a MOSFET, the characteristics of a MOSFET largely vary as the thickness of the channel region is varied.

SUMMARY OF THE INVENTION

It is an object of the present invention to provide semiconductor device and method for manufacturing the same, wherein at least one opening extending between LDD regions and exposing a buried insulating layer is formed so that a gate electrode surrounds the surface of a channel region, thereby increasing the current driving capability of the device and improving the short channel effect.

In order to achieve the above object of the present invention, there is provided a method for forming semiconductor device, the method comprising the steps of: (a) sequentially forming a SiGe epitaxial layer and a Si epitaxial layer on a semiconductor substrate; (b) forming a device isolation film defining an active region on the semiconductor substrate; (c) implanting an impurity into the Si epitaxial layer to form a channel region; (d) etching the Si epitaxial layer and a predetermined depth of the SiGe epitaxial layer on the channel region to form an opening; (e) forming a channel stop ion implant region in the semiconductor substrate under a portion of SiGe epitaxial layer exposed through the opening; (f) forming and patterning a gate dielectric film, a conductive layer for gate electrode and a hard mask insulating film on the semiconductor substrate including a sidewall and a lower portion of the opening to form a stacked structure of gate dielectric film pattern, a gate electrode and a hard mask insulating film pattern; (g) forming LDD regions in the Si epitaxial layer at both sides of the stacked structure; (h) forming a sidewall spacer on a sidewall of the stacked structure; (i) etching the Si epitaxial layer, the SiGe epitaxial layer and a predetermined depth of the semiconductor substrate at both side of the sidewall spacer; (j) removing the SiGe epitaxial layer under the Si epitaxial layer below the stacked structure to form a space; (k) forming a buried insulating film filling the space; (l) forming a silicon layer in the active region at both sides of the sidewall spacer; and (m) forming source/drain regions in the silicon layer.

There is also provided a semiconductor device comprising: a semiconductor substrate comprising an active region defined by a device isolation film; a channel stop ion implant region disposed on a surface of the semiconductor substrate in the active region; a buried insulating film disposed on the surface of the semiconductor substrate; a Si epitaxial layer disposed on the buried insulating film, wherein the Si epitaxial layer exposes a portion of the buried insulating film and the exposed portion extends between LDD regions; a channel region disposed in the Si epitaxial layer and LDD regions disposed adjacent to the channel region; a stacked structure of a gate dielectric film pattern, a gate electrode and a hard mask insulating film pattern, the stacked structure at least covering the exposed portion of the buried insulating film and the Si epitaxial layer; a sidewall spacer disposed on a sidewall of the stacked structure; and source/drain regions disposed in the active region at both sides of the sidewall spacer adjacent to the LDD regions.

DETAILED DESCRIPTION OF THE PREFERRED EMBODIMENTS

The present invention will be explained in detail referring to the accompanying drawings.

Figure 1:
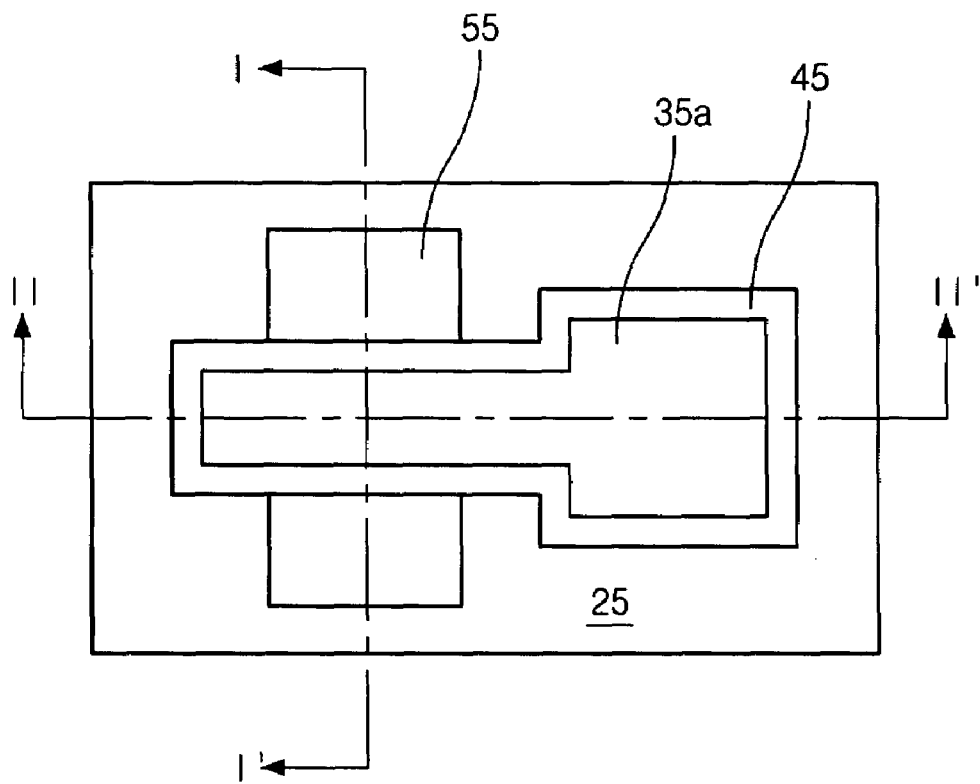
FIG. 1 is a top-view illustrating a layout of a conventional semiconductor device.
Figure 2:
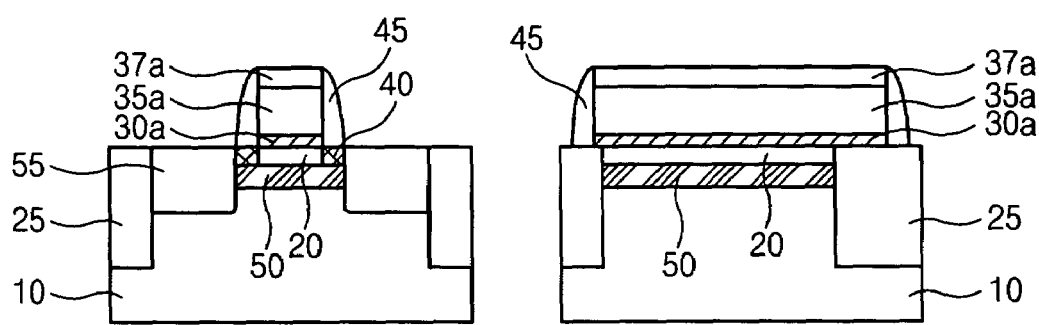
FIG. 2 is a cross-sectional diagram taken along the lines I–I' and II–II' of FIG. 1.
Figure 3A:
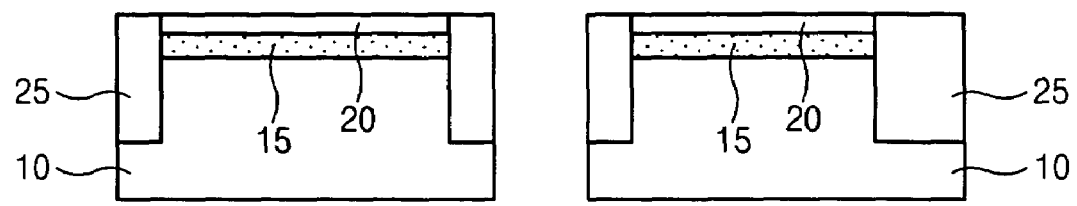
FIGS. 3a through 3g are cross-sectional diagrams illustrating a conventional method for manufacturing semiconductor device of FIG. 1.
Figure 3B:
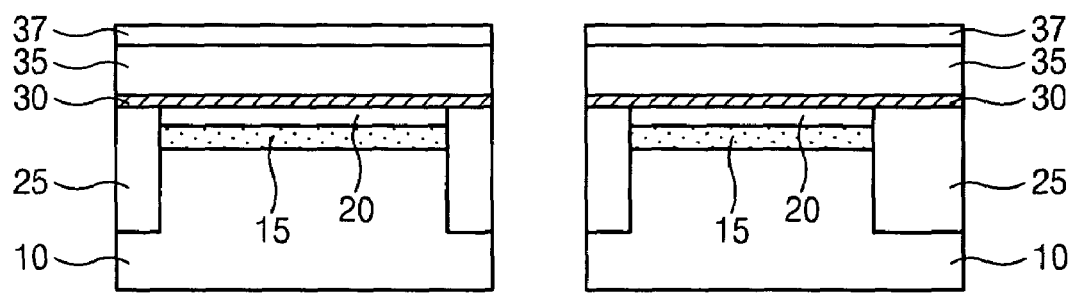
Figure 3C:
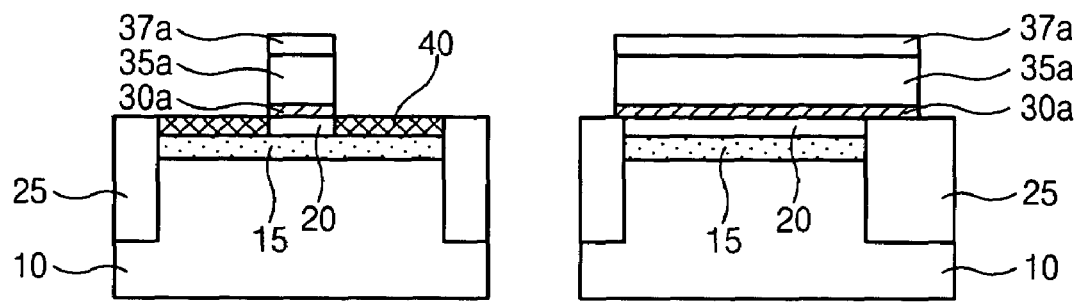
Figure 3D:
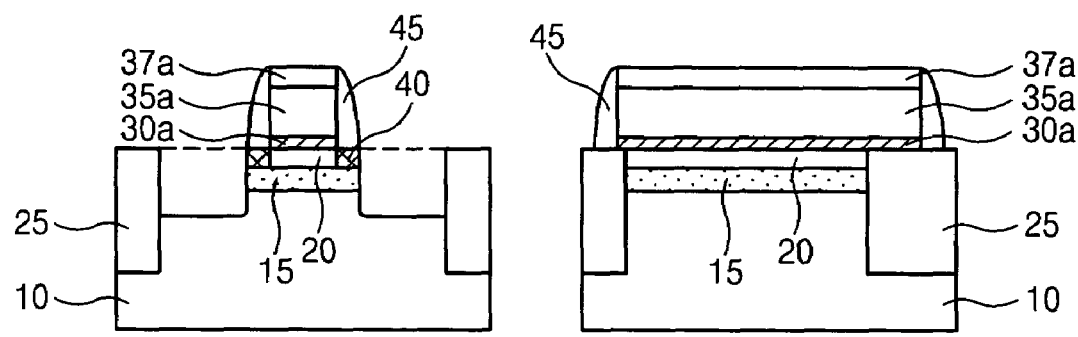
Figure 3E:
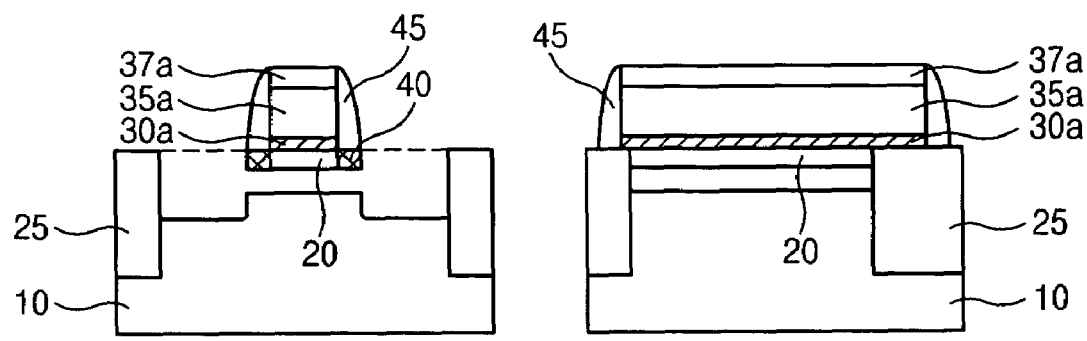
Figure 3F:
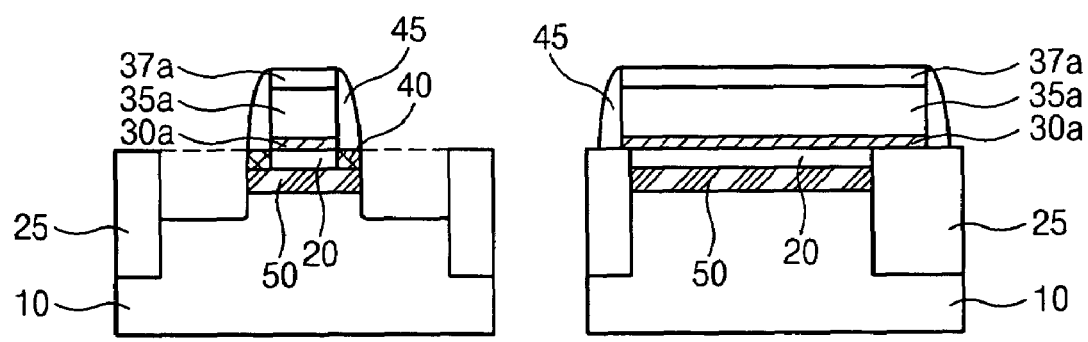
Figure 3G:
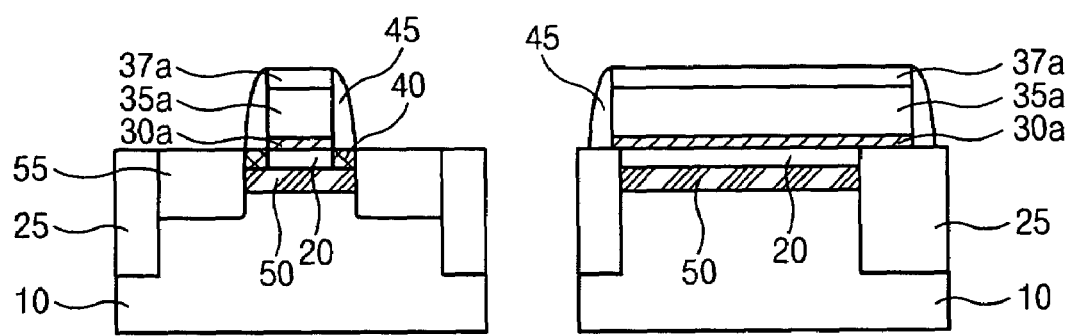
Figure 4:
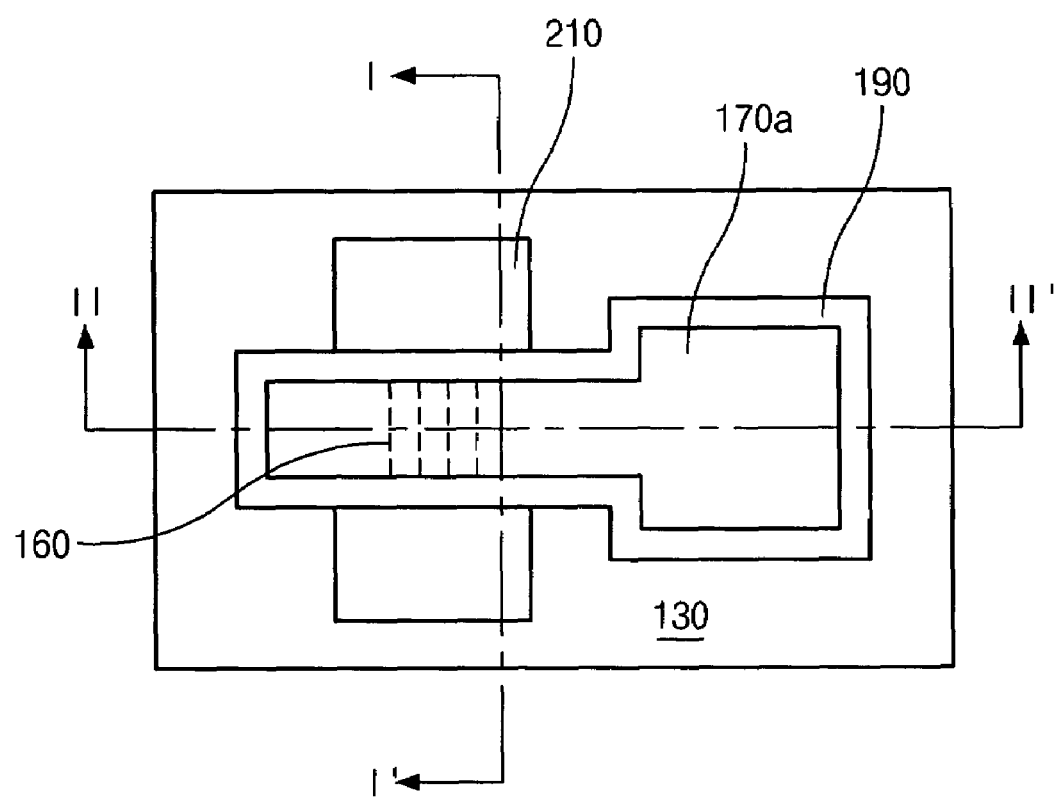
FIG. 4 is a top-view illustrating a layout of semiconductor device in accordance with the first embodiment of the present invention.
Figure 5:
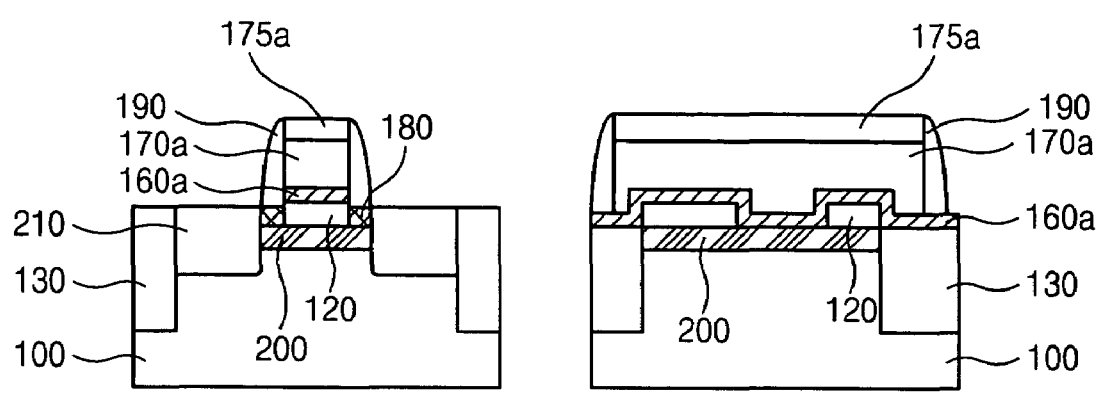
FIG. 5 is a cross-sectional diagram taken along the lines I–I' and II–II' of FIG. 4.

FIG. 4 is a top-view illustrating a layout of a semiconductor device in accordance with the first embodiment of the present invention, and FIG. 5 is a cross-sectional diagram taken along the lines I–I' and II–II' of FIG. 4.

Referring to FIGS. 4 and 5, the semiconductor device in accordance with the first embodiment of the present invention comprises a semiconductor substrate 100 having an active region defined by a device isolation film 130. A channel stop ion implant region 150 is disposed on a surface of the semiconductor substrate 100 in the active region. A stacked structure of a buried insulating film 200 and a Si epitaxial layer 120 is disposed on the surface of the semiconductor substrate 100. A channel region (not shown) and LDD regions 180 adjacent to the channel region are formed in the Si epitaxial layer 120. The Si epitaxial layer 120 exposes a portion of the buried insulating film 200 and the exposed portion extends between LDD regions 180, i.e. extends from a sidewall of one LDD region 180 to that of the other LDD region 180.

A stacked structure of a gate dielectric film pattern 160a, a gate electrode 170a and a hard mask insulating film pattern 175a is disposed on the surface of the semiconductor substrate so as to cover at least the exposed surface of the buried insulating film 200 and the Si epitaxial layer 120. That is, the gate electrode 170a completely surrounds the channel region.

A sidewall spacer 190 is disposed on a sidewall of the stacked structure of the gate dielectric film pattern 160a, the gate electrode 170a and the hard mask insulating film pattern 175a. Source/drain regions (not shown) are disposed in the active region at both sides of the sidewall spacer 190 adjacent to the LDD regions 180.

FIGS. 6a through 6h are cross-sectional diagrams taken along the lines I–I' and II–II' of FIG. 4, illustrating method for manufacturing the semiconductor device of FIG. 5.

Figure 6A:
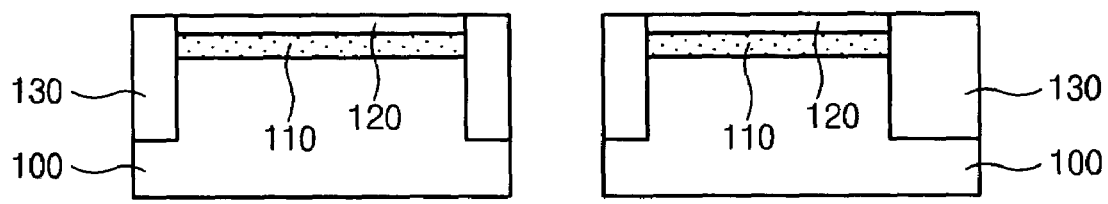
FIGS. 6a through 6h are cross-sectional diagrams illustrating method for manufacturing semiconductor device of FIG. 5.

Referring to FIG. 6a, a SiGe epitaxial layer 110 and a Si epitaxial layer 120 are sequentially formed on a semiconductor substrate 100. Thereafter, a device isolation film 130 defining an active region is formed on the semiconductor substrate 100.

Figure 6B:
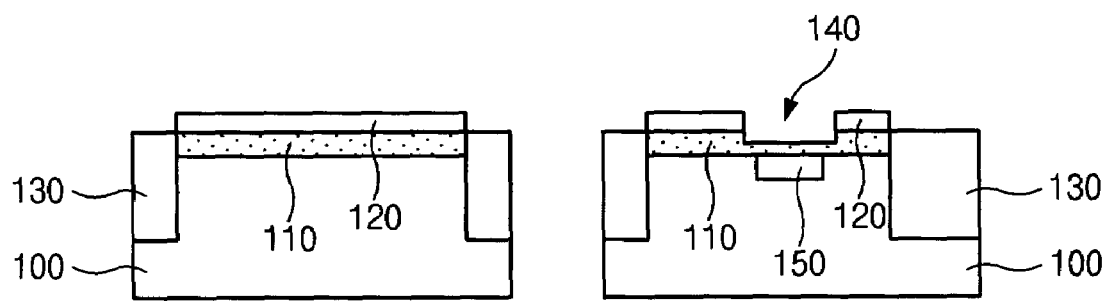

Referring to FIG. 6b, a buffer oxide film (not shown) is formed on the entire surface of the semiconductor substrate 100. An impurity is implanted into the Si epitaxial layer 120 to form a channel region (not shown). A stacked structure of a buffer oxide film and a buffer nitride film may be used instead of the buffer oxide film. Thereafter, the buffer oxide film, the Si epitaxial layer 120 and a predetermined depth of the SiGe epitaxial layer 110 on the channel region are etched to form an opening 140 exposing the SiGe epitaxial layer 110. The opening 140 extends between LDD regions formed in a subsequent process to exposes sidewalls of the LDD regions. That is, the opening 140 extends from one LDD region to the other LDD region and has a width substantially the same as that of the gate electrode. Although not shown, the SiGe epitaxial layer 110 exposed through the opening 140 may further be etched to expose the semiconductor substrate 100. A predetermined depth of the semiconductor substrate 100 of the exposed through the opening 140 after etching the SiGe epitaxial layer 110 may also be etched.

Thereafter, a channel stop ion implant region 150 is formed in the semiconductor substrate 100 under a portion of SiGe epitaxial layer 110 exposed through the opening 140. The buffer oxide film or the stacked structure of the buffer oxide film and the buffer nitride film is removed. The device isolation film 130 is then recessed by etching.

Figure 6C:
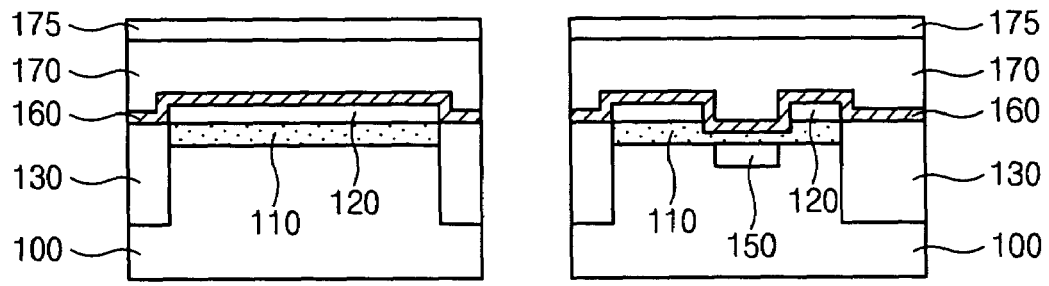
Figure 6D:
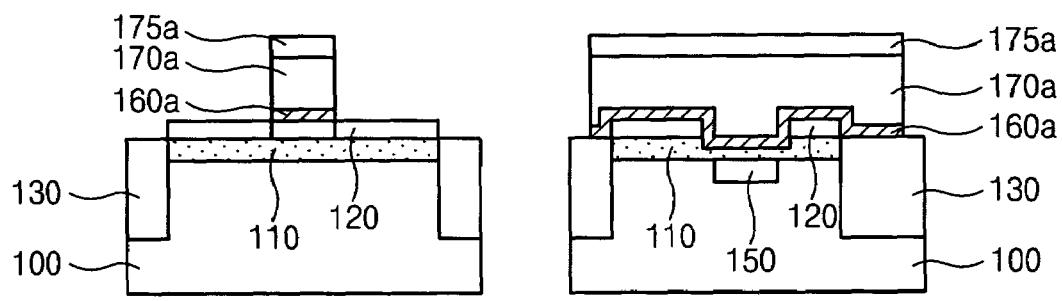

Referring to FIGS. 6c and 6d, a gate dielectric film 160, a conductive layer 170 for gate electrode and a hard mask insulating film 175 consisting of a CVD insulating film are sequentially formed on the entire surface of the semiconductor substrate 100 including a sidewall and a lower portion of the opening 140 and then patterned to form a stacked structure of a gate dielectric film pattern 160a, a gate electrode 170a and a hard mask insulating film pattern 175a. Preferably, the gate dielectric film 160 is selected from the group consisting of an oxide film, an oxynitride film, ONO insulating film comprising a stacked structure of oxide/nitride/oxide films, and HfO$_2$ film.

When the SiGe epitaxial layer 110 is etched to expose the semiconductor substrate 100 during the etching process of FIG. 6b, the gate dielectric film 160 is formed in such a manner that the gate dielectric film 160 covers the surface of the semiconductor substrate 100 at the bottom of the opening 140 and a sidewall of SiGe epitaxial layer 110. When the semiconductor substrate 100 is further etched after the etching process of the SiGe epitaxial layer 110 in FIG. 6b, the gate dielectric film 160 is formed in such a manner that the gate dielectric film 160 covers the surface of the bottom and the sidewall the of the semiconductor substrate 100 in the opening 140 and the sidewall of SiGe epitaxial layer 110.

Next, LDD regions 180 are formed in the Si epitaxial layer 110 in the active region adjacent to the channel at both sides of the gate electrode 170a.

Figure 6E:
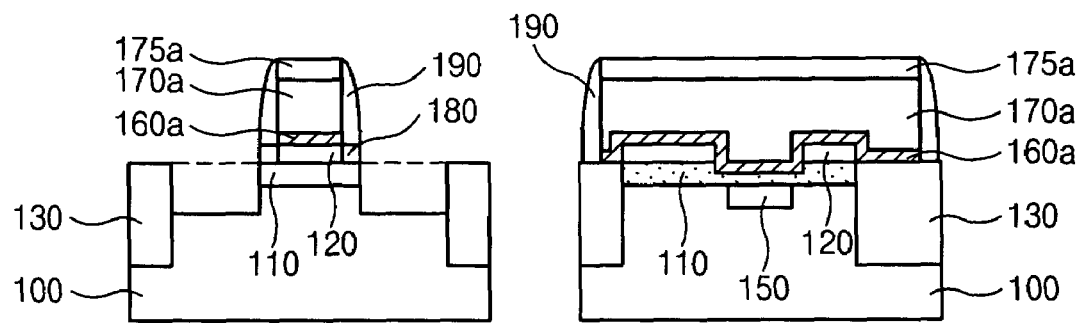

Referring to FIG. 6e, a sidewall spacer 190 is formed on a sidewall of the stacked structure of the gate dielectric film pattern 160a, the gate electrode 170a and the hard mask insulating film pattern 175a. Thereafter, the Si epitaxial layer 120, the SiGe epitaxial layer 110 and a predetermined depth of the semiconductor substrate 100 at both side of the sidewall spacer 190 are etched away using the sidewall spacer 190 as an etching mask to expose sidewalls of the Si epitaxial layer 120 and the SiGe epitaxial layer 110 and the surface and the sidewall of the semiconductor substrate 100.

Figure 6F:
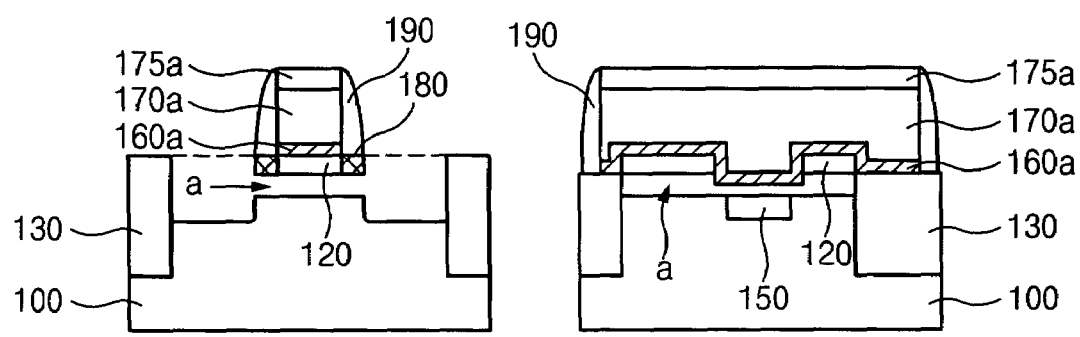

Referring to FIG. 6f, the SiGe epitaxial layer 110 under the Si epitaxial layer 120 below the stacked structure of the gate dielectric film pattern 160a, the gate electrode 170a and the hard mask insulating film pattern 175a is wet etched to form a space denoted as "a".

Figure 6G:
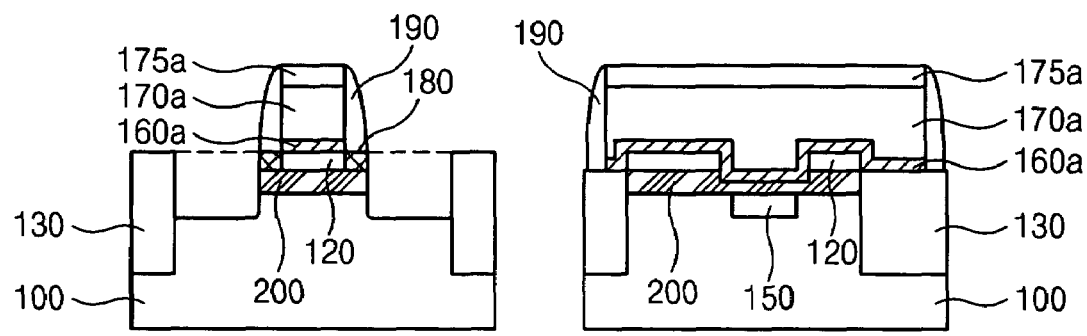

Referring to FIG. 6g, an insulating film (not shown) is formed in the space "a", the exposed surfaces of the Si epitaxial layer 120 and the semiconductor substrate 100. The insulating film is then wet etched to form a buried insulating film 200 filling the space "a".

Figure 6H:
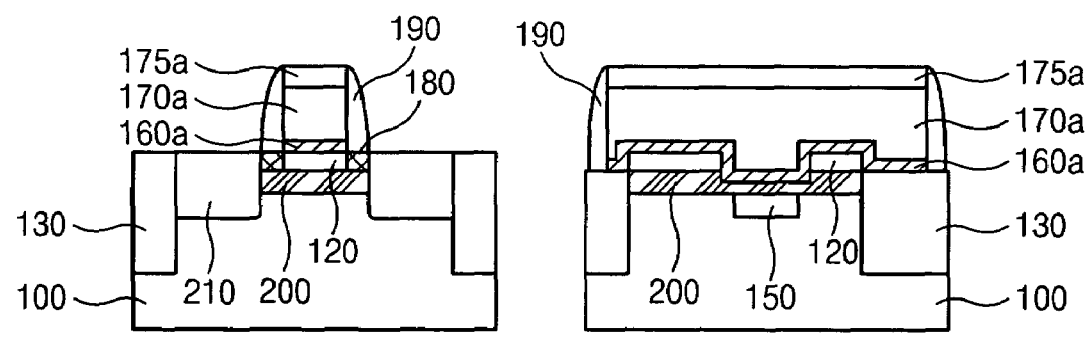

Referring to FIG. 6h, a silicon layer 210 is grown in the active region at both sides of the sidewall spacer where the Si epitaxial layer 120, the SiGe epitaxial layer 110 and a predetermined depth of the semiconductor substrate 100 have been removed. Preferably, the silicon layer 210 comprises a Si growth layer, polysilicon layer or a stacked structure of Si growth layer and polysilicon layer. An impurity is then implanted to form source/drain regions in the silicon layer 210.

Figure 7:
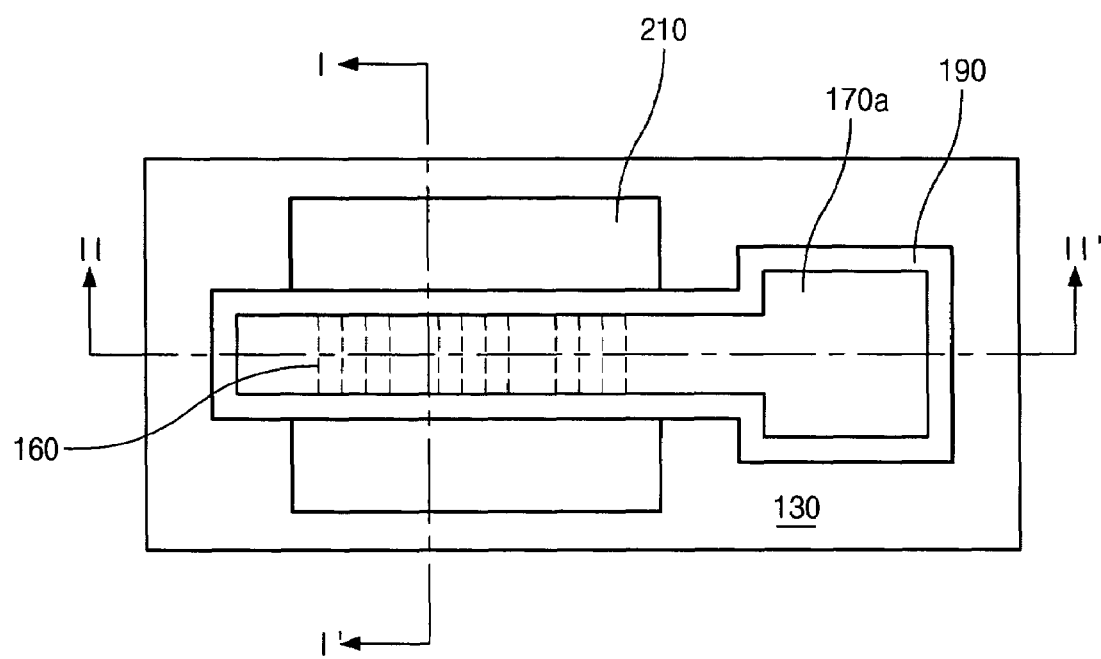
FIG. 7 is a top-view illustrating a layout of semiconductor device in accordance with the second embodiment of the present invention.
Figure 8:
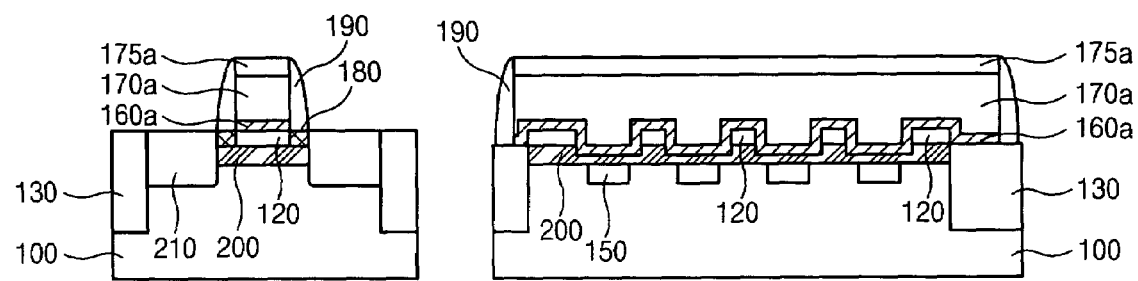
FIG. 8 is a cross-sectional diagram taken along the lines I–I' and II–II' of FIG. 7.

FIG. 7 is a top-view illustrating a layout of semiconductor device in accordance with the second embodiment of the present invention, and FIG. 8 is a cross-sectional diagram taken along the lines I–I' and II–II' of FIG. 7.

First, the process shown in FIG. 6a is performed. Now referring to FIGS. 7 and 8, an impurity is implanted into the Si epitaxial layer 120 to form a channel region (not shown). The Si epitaxial layer 120 and a predetermined depth of the SiGe epitaxial layer 110 on the channel region are etched to form a plurality of openings 140 exposing the SiGe epitaxial layer 110. The plurality of openings 140 extend between the LDD regions 180, i.e. from one LDD region to the other LDD region and are parallel to one another.

Thereafter, a plurality of channel stop ion implant regions 150 are formed in the semiconductor substrate 100 under a portion of SiGe epitaxial layer 110 exposed through the plurality of openings 140. Since at least two openings 140 are formed, at least two channel stop ion implant regions 150 are formed.

Next, the processes shown in FIGS. 6c through 6h are performed to complete the semiconductor device in accordance with the second embodiment of the present invention.

As described above, in accordance with the semiconductor device and the method for manufacturing the same, at least one opening parallel to one another extending between LDD regions and exposing a buried insulating layer is formed so that a gate electrode surrounds the surface of a channel region, thereby (i) increasing the current driving capability of the device, (ii) allowing the formation of a relatively thick Si epitaxial layer comprising a channel region, (iii) decreasing the sensitivity of characteristics of the device dependent upon the thickness of the Si epitaxial layer, and (iv) preventing a short channel effect even when a channel shorter than a conventional one is formed.

What is claimed is:

1. A method for forming semiconductor device, the method comprising the steps of:

(a) sequentially forming a SiGe epitaxial layer and a Si epitaxial layer on a semiconductor substrate;
(b) forming a device isolation film defining an active region on the semiconductor substrate;
(c) implanting an impurity into the Si epitaxial layer to form a channel region;
(d) etching the Si epitaxial layer and a predetermined depth of the SiGe epitaxial layer on the channel region to form an opening;
(e) forming a channel stop ion implant region in the semiconductor substrate under a portion of SiGe epitaxial layer exposed through the opening;
(f) forming and patterning a gate dielectric film, a conductive layer for gate electrode and a hard mask insulating film on the semiconductor substrate including a sidewall and a lower portion of the opening to form a stacked structure of gate dielectric film pattern, a gate electrode and a hard mask insulating film pattern;
(g) forming LDD regions in the Si epitaxial layer at both sides of the stacked structure;
(h) forming a sidewall spacer on a sidewall of the stacked structure;
(i) etching the Si epitaxial layer, the SiGe epitaxial layer and a predetermined depth of the semiconductor substrate at both side of the sidewall spacer;
(j) removing the SiGe epitaxial layer under the Si epitaxial layer below the stacked structure to form a space;
(k) forming a buried insulating film filling the space;
(l) forming a silicon layer in the active region at both sides of the sidewall spacer; and
(m) forming source/drain regions in the silicon layer.

2. The method according to claim 1, wherein the step (d) comprises forming a plurality of openings, wherein the plurality of the openings extend between the LDD regions and are parallel to one another.

3. The method according to claim 1, further comprising forming a buffer oxide film or a stacked structure of buffer oxide film and buffer nitride film prior to performing the step (c), and removing the buffer oxide film or the stacked structure of buffer oxide film and buffer nitride film after performing the step (e).

4. The method according to claim 1, wherein the gate dielectric film selected from the group consisting of an oxide film, an oxynitride film, ONO insulating film comprising a stacked structure of oxide/nitride/oxide films, and $HfO_2$ film.

5. The method according to claim 1, wherein the silicon layer comprises a Si growth layer, polysilicon layer or a stacked structure of Si growth layer and polysilicon layer.

6. The method according to claim 1, wherein the step (d) further comprises etching the SiGe epitaxial layer exposed through the opening to expose the semiconductor substrate.

7. The method according to claim 1, wherein the step (d) further comprises etching the SiGe epitaxial layer exposed through the opening to expose the semiconductor substrate and etching a predetermined depth of the exposed portion of the semiconductor substrate.

* * * * *